United States Patent [19]

Umetsu et al.

[11] 4,378,602
[45] Mar. 29, 1983

[54] COMMUNICATION SYSTEM WITH A LIMITED COMMUNICATION AREA

[75] Inventors: Yutaka Umetsu, Tama; Takeshi Takeuchi, Yokohama, both of Japan

[73] Assignee: Hochiki Corporation, Tokyo, Japan

[21] Appl. No.: 156,491

[22] Filed: Jun. 4, 1980

[30] Foreign Application Priority Data

Jun. 8, 1979 [JP] Japan .................... 54-71161

[51] Int. Cl.³ .................... H04B 3/60; H04B 15/00
[52] U.S. Cl. .................... 455/1; 455/3; 455/54; 455/57; 455/63
[58] Field of Search ............ 455/1, 3, 41, 49, 50, 455/55-57, 63, 53, 54; 179/1 DD, 82

[56] References Cited

U.S. PATENT DOCUMENTS 2,567,431  9/1951  Halstead ........................ 179/82
3,996,518  12/1976  Halstead et al. ............... 179/82

*Primary Examiner*—Marc E. Bookbinder
*Attorney, Agent, or Firm*—Phillips, Moore, Weissenberger, Lempio & Majestic

[57] ABSTRACT

In a communication system including communication transmitting means for modulating a carrier wave having a fixed frequency by a communication signal having communication content and for radiating the modulated signal wave, and receiving means for receiving the modulated signal radiated from the communication transmitting means to demodulate the communication signal, the communication system comprises a communication shielding area provided at a desired location on a boundary between communication areas for limiting the extent of the communication areas in which the modulated signal is transmitted, and shielding transmitting means for transmitting the shielding signal wave into said communication shielding area, the shielding signal wave being received by the receiving means tuned to the carrier wave frequency at a signal receiving level equal to or more than the receiving level of the modulated signal. This system can reliably and simply limit each of the communication areas without interference between the areas and is suitable for a private or fee-charging communication system.

8 Claims, 5 Drawing Figures

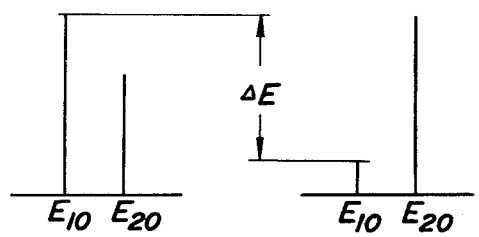
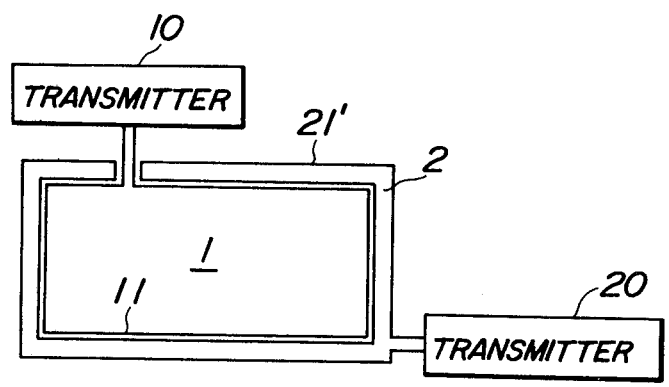

COMMUNICATION SYSTEM WITH A LIMITED COMMUNICATION AREA

BACKGROUND OF THE INVENTION

The present invention relates to a communication system with a limited communication area.

In a communication system used in a field, for example, for communication in a hall, for simultaneous interpretation in an international conference, or for an explanation to visitors in a zoological garden or museum, a radiowave or induction communication system is used for the communication of information in such a limited receiving field. In this case, such a communication is often required to be limited within a specific area for the reason that the contents of the communication must be kept secret or that a fee-charging system is employed. The attempt to limit the communication area becomes difficult when the communication area is wide, even if an electromagnetic shielding method is employed for the purpose of limiting the communication area. In this respect, the communication system has many problems in practical use.

Particularly, to provide an explanation to visitors in a zoological garden or museum, a communication system is desired that has transmitters having a plurality of frequencies, which are substantially the same, which are used as carrier waves for transmitting communication signals having different information in different communication areas, and that has a receiver for receiving the different communication signals as the receiver is moved, without the necessity of a troublesome tuning operation. In such an application, there is no problem of interference when the adjacent communication areas are far away from each other. In the other case where the adjacent communication areas are close to each other, however, it is possible that the explanation in one communication area is received in another communication area or that the interference occurs.

SUMMARY OF THE INVENTION

With the above in view, the present invention has as an object to provide a communication system which may reliably and simply limit each of the communication areas and is suitable for a private communication system or a fee-charging communication system, and which prevents the interference between the communication areas.

The present invention has as another object to provide a communication system which limits a communication area without providing any large-scaled equipment such as an electromagnetic shield.

The present invention has yet as another object to provide a communication system, operable within a limited communication area, which can be constructed not by special devices, but only by conventional communication devices.

In order to achieve these objects, a communication system according to the invention has a combination of a usual transmitting means and a usual receiving means which transmits and receives, respectively, a communication signal representing a desired communication content within a specific communication area. For example, a conventional portable radio receiver having an automatic gain control (AGC) or an automatic frequency control (AFC) function can be utilized as the receiving means. In order to limit the extent of the communication area, a communication shielding area is set up around a part or the entire periphery of the communication area, and a shielding signal wave having a different content is additionally transmitted from an additional transmitter. In the present invention, the shielding signal wave has a carrier frequency which can directly be received by the receiving means which is tuned to a communication wave obtained by modulating a carrier wave with a fixed frequency by a communication signal. The additional shielding signal wave is radiated into the communication shielding area at a stronger electric field than that of the communication wave within the communication area. Therefore, the same receiving means, when placed in the communication shielding area, receives the additional shielding signal wave at a signal level higher than that at which the receiving means receives the communication wave in the communication area. According to one embodiment of this invention, the receiving level of the communication signal in the communication shielding area is lowered by means of the AGC function in the receiving means. In another embodiment of the invention, the receiving level is lowered by means of the AFC function of the receiving means. Further, the receiving level can be lowered by means of both the AGC and AFC functions.

Specifically, in the communication shielding area, the AGC of the receiving means lowers the receiving signal level of the high level shielding signal wave down to a fixed demodulation or detection level of the receiving means. The receiving level is lowered greater in the communication shielding area than in the communication area where the receiving level is also lowered by the AGC. Therefore, even when the communication wave is received by the receiving means in the communication shielding area, the demodulation or detection output level of the reproduced communication signal is considerably reduced, so that a loudspeaker or earphone in the receiving means scarcely reproduces the sound.

The shielding signal may be any type of signal, as long as the low frequency output signal reproduced from the receiving means is other than the communication signal; for example, a non-modulated signal, a signal modulated by a program having a content different from the communication signal, a signal modulated by a signal having frequencies outside an audio-frequency band, a signal modulated by a signal having a code content different from a communication signal for digital modulation, or the like.

When use is made of the AFC function of the receiving means, the carrier frequency of the shielding signal wave, like the shielding signal in the case of the AGC, is selected to be different from the carrier frequency of the communication wave, within a range where the tuning is controlled by the AFC. With such selection of the carrier frequency of the shielding signal wave, the receiving means is tuned to the shielding signal wave of a high level and tuned out of the communication wave, so that the receiving output level of the communication signal is reduced extremely. In this case, if the receiving means also has the AGC function, the AGC functions to reduce the receiving output level of the communication signal in addition to the effect by the AFC. Therefore, both the AFC and AGC cooperate to interrupt almost perfectly the reception of the communication signal in the shielding area.

The present invention is well adapted for a communication system where a plurality of communication areas to which respective signals having different communication content are arranged close to each other, for example, a communication system for providing an explanation to visitors in a zoological garden or the like. In this case, communication shielding areas are allotted to respective boundaries between or among the communication areas. The communication wave and the shielding signal wave are radiated by respective loop antennas in the communication area and communication shielding areas. As a result, interference in the vicinity of the boundaries is prevented satisfactorily, which otherwise takes place when the receiving means is moved from one communication area to another. In the case that the communication shielding area is almost entirely enclosed by a loop antenna, the present invention can be employed to make it possible to receive a communication in one communication area beyond the other communication area.

Other objects and features of the invention will be apparent from the following description taken in connection with the accompanying drawings, in which;

BRIEF DESCRIPTION OF THE DRAWINGS

FIGS. 2a and 2b are graphic representations illustrating the comparison of the receiving signal levels for explaining the operation of the present invention; and FIGS. 3 and 4 are block diagrams illustrating other embodiments of a communication system according to the invention, respectively.

DESCRIPTION OF THE PREFERRED EMBODIMENTS

Figure 1:
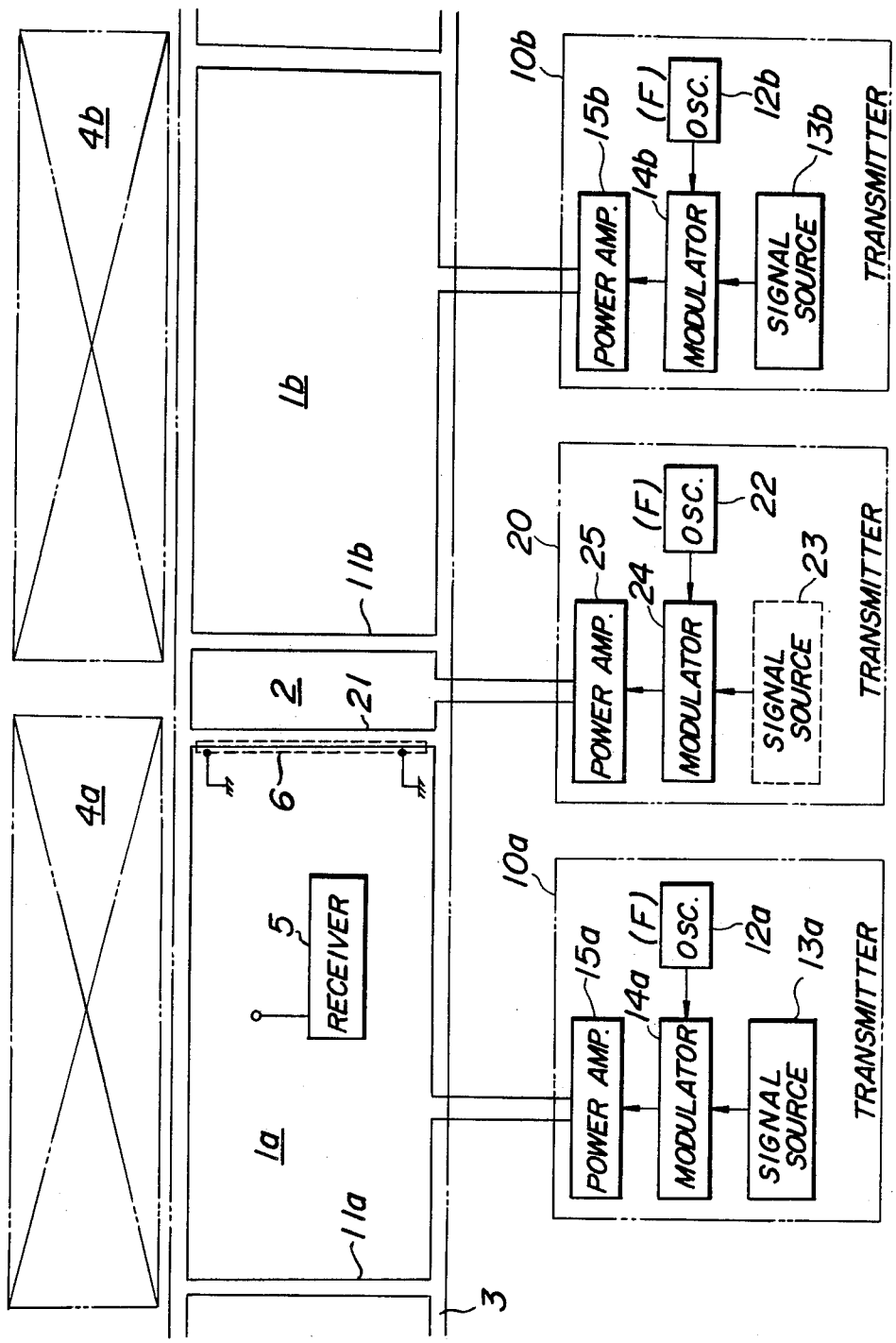
FIG. 1 is a block diagram illustrating an embodiment of a communication system according to the invention.

FIG. 1 shows an embodiment of a communication system according to the invention. In FIG. 1, reference numerals 4a and 4b designate sections presenting breeding grounds or enclosures for different kinds of wild animals or corners for different exhibitions. A path 3 is disposed along the sections 4a and 4b. Communication areas 1a and 1b are provided on the path 3 for transmitting radio waves having different explanatory contents with respect to these sections 4a and 4b. A communication shielding area 2 for interrupting the reception of the explanatory radio waves to prevent interference is located at a boundary region between the communication areas 1a and 1b. In this way, the boundaries of the communication areas 1a and 1b are limited by the communication shielding area 2. Reference numeral 5 denotes a receiver being moved along the path 3. A conventional portable radio or a car radio with AGC or AFC is preferably used for the receiver 5. The communication areas 1a and 1b and the communication shielding area 2 are defined by loop antennas 11a and 11b and 21, respectively. Communication waves are fed to loop antennas 11a and 11b from transmitters 10a and 10b, respectively. Both of the transmitters 10a and 10b, having the same construction, are respectively comprised of carrier wave oscillators 12a and 12b, communication signal sources 13a and 13b such as tape recorders as program sources, modulators 14a and 14b for modulating the carrier waves having a frequency F generated from the oscillators 12a and 12b by communication signals from the communication signal sources 13a and 13b, and power amplifiers 15a and 15b for power-amplifying the output signals derived from the modulators 14a and 14b to transfer the output signals to the antennas 11a and 11b. The transmitters 10a and 10b have exactly the same construction and the same carrier wave frequency, except that the content of the communication signals in the communication sources 13a and 13b is different. The carrier wave frequencies are, for example, 1 MHz. The output powers from the transmitters 10a and 10b are determined, respectively, depending on the extent of the communication areas 1a and 1b and are generally 1 W or less. This value provides a sufficient electric field intensity in practical use.

A transmitter 20 for supplying a communication shielding signal to the loop antenna 21 of the communication shielding area 2 is comprised of an oscillator 22 for oscillating a carrier wave having the same frequency F as that of the oscillators 12a and 12b, a modulator 24 similar to the modulators 14a and 14b, and a power amplifier 25 similar to the power amplifiers 15a and 15b. The modulator 24 applies the carrier wave from the oscillator 22 to the amplifier 25, without modulating it. The amplifier 25 amplifies the carrier wave to have an amplitude higher than that of the transmitters 10a and 10b, and applies the amplified carrier wave to the loop antenna 21, as a non-modulated signal wave. The output power of this non-modulated signal may be a high power of 2 W if the transmitting power of the transmitters 10a and 10b is 500 mW. Further, the present embodiment may be modified such that the modulator 24 is omitted and the output signal from the oscillator 22 is directly applied to the amplifier 25.

In this embodiment having the above-mentioned transmitting and receiving system, when the receiver 5 with the AGC function is placed in the area 1a, the receiver 5 receives the communication wave from the transmitter 10a, so that the communication signal delivered from the communication source 13a can be listened to through a loudspeaker or an earphone (not shown) of the receiver 5. At this time, the receiver 5 receives the communication wave $E_{10}$ from the transmitter 10a at a high reception level, as shown in FIG. 2a, and the shielding signal wave $E_{20}$ from the transmitter 20 at a lower reception level than the communication wave $E_{10}$. Accordingly, the communication wave $E_{10}$ is demodulated and detected in a normal way. At the time that the receiver 5 has moved into the communication shielding area 2, the receiver 5 receives at a high reception level the shielding signal wave which is radiated from the loop antenna 21 with a high power. As a result, the AGC of the receiver functions to lower the level of the received shielding signal wave $E_{20}$ to a given level, as shown in FIG. 2b. At this time, the communication wave $E_{10}$ currently being received from the transmitter 10a at a lower level than that of the shielding signal wave $E_{20}$, is also lowered correspondingly by the same level. It follows that the level of the communication wave $E_{10}$ is reduced by a level difference ($\Delta E$) caused by the AGC action, when compared to the level of the communication wave $E_{10}$ in the communication area 1a. Accordingly, in the communication shielding area 2, the reception of the shielding signal wave $E_{20}$ with a higher electric field intensity than in the communication area 1a causes the AGC of the receiver 5 to act more strongly, whereby the receiving signal level of the communication wave $E_{10}$ is considerably lowered and thus it is almost impossible to receive the communication wave $E_{10}$. The result is the limitation of the communication area 1a. At the time that the receiver 5 has moved from the communication shielding area 2 to the second communication area 1b, the electric field intensity of the second communication wave from the loop antenna 11b increases, so that the second communication wave is received and the communication signal produced from the communication signal source 13b is available for listening.

This is likewise applicable for the case where the receiver 5 is moved from the area 1b to the area 2, i.e. in the inverse direction. During this movement, it is sufficient that the receiver 5 stays tuned to the frequency F and no further tuning operation is required.

Thus, the present invention utilizes the function of the AGC. Accordingly, as the electric field intensity of the signal wave in the communication shielding area 2 is made higher, compared to those of the signal waves in the communication areas 1a and 1b, it is impossible to receive the communication wave in the area 2 located between the areas 1a and 1b. On the other hand, as the electric field intensity in the area 2 is made higher, the communication areas 1a and 1b are forced to be narrower. In practical use, the output powers of the respective transmitters 10a, 10b and 20 and the positions of the loop antennas 11a, 11b and 21 are accordingly selected so as to meet the extent of the respective areas once set.

In some correlation between the directionalities of the loop antennas 11a, 11b and 21, and the receiving antenna of the receiver 5, the sound output from the receiver 5 may abruptly increase on the boundary between the area 1a or 1b and the area 2. This phenomena may be prevented by shielding the portion of the loop antenna 11a which is adjacent to the loop antenna 21 by means of a shield line 6. Since the oscillators 12a and 22 have the same oscillating frequency F, a single oscillator for generating the same oscillating frequency F, in place of those oscillators, 12a, 12b and 22, may be used commonly for the modulators 14a, 14b and 24.

While in the embodiment mentioned above, the non-modulated signal is used for the shielding signal wave delivered from the transmitter 20, a signal source 23 as indicated by a dotted line in FIG. 1 may additionally be provided for producing a signal having a content different from those of the signals from the communication signal sources 13a and 13b or a signal with a frequency outside the audio-frequency band. The modulator 24 modulates the oscillating signal from the oscillator 22 by the output signal from the signal source 23. In a further case where the communication signal sources 13a and 13b are subject to a digital modulation, the modulator 24 may modulate the oscillating output from the oscillator 22 by a digital code signal distinguishable from the output of the digital modulation.

Figure 3:
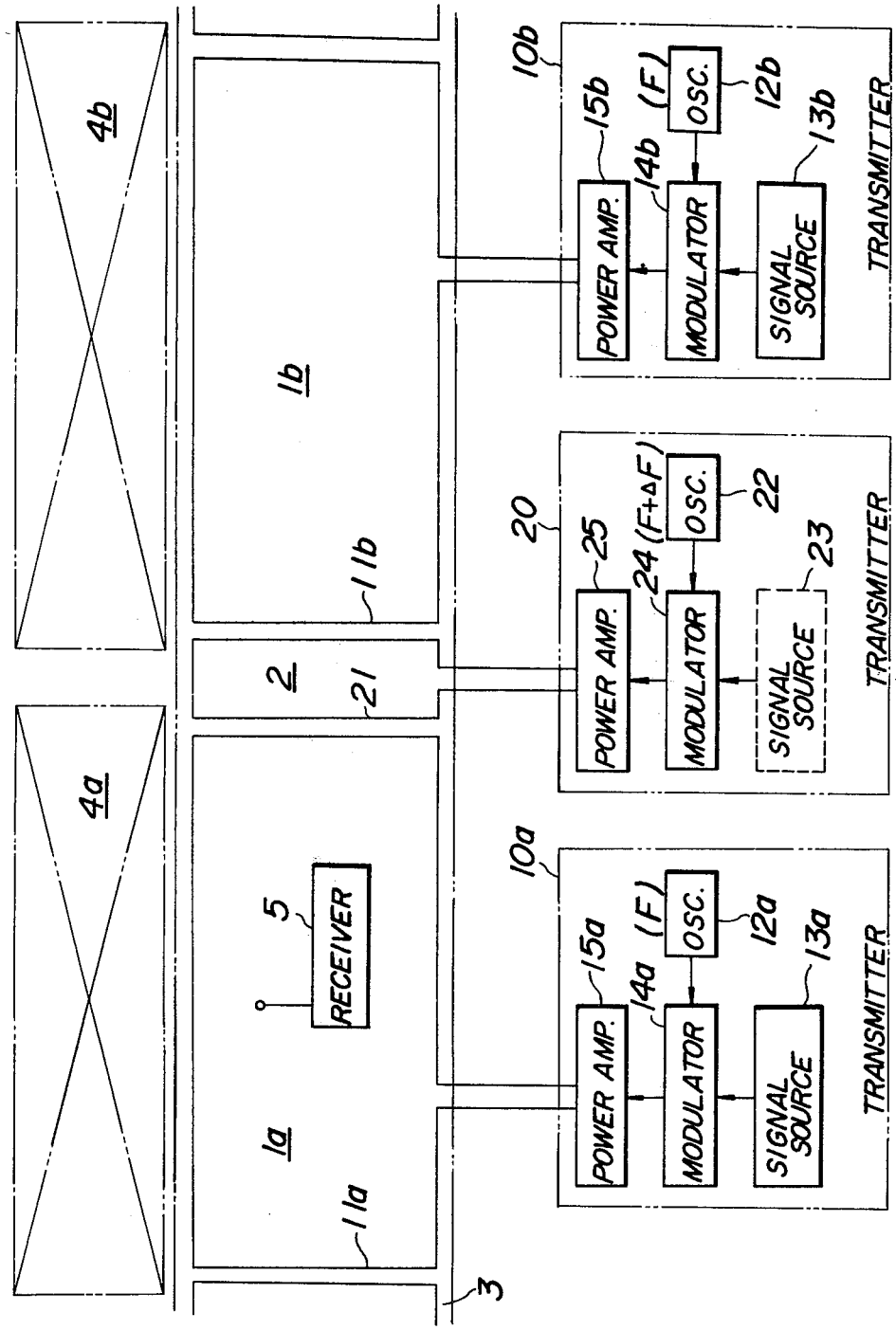

Turning now to FIG. 3, there is shown another embodiment of a communication system according to the present invention. In FIG. 3, identical reference numerals are used to designate like portions in FIG. 1. In this embodiment, the receiver 5 has the AFC function. The carrier wave frequency of the transmitter 20 is higher by $\Delta F$ than the frequency F of the remaining transmitters 10a and 10b. Namely, the carrier wave frequency is $F + \Delta F$. The frequency increment $\Delta F$ is selected within a range controllable by the AFC function of the receiver 5. The frequency increment may be 50 KHz, for example, if the carrier frequency F is selected to be 1 MHz. As a result, both of the communication waves of $F = 1$ MHz and the shielding signal wave of $F + \Delta F = 1.05$ MHz can be received directly by a receiver tuned to the same frequency of 1 MHz.

It is evident that the carrier frequency may be lower by $\Delta F$ than the frequency F of the other transmitters 10a and 10b. Alternatively, $F \pm \Delta F$ may be so selected as to fall within a frequency deviation controllable by the AFC of the receiver 5, where $F - \Delta F$ represents the carrier frequency of the transmitter 10a, F indicates the carrier frequency of the transmitter 20, and $F + \Delta F$ the carrier frequency of the transmitter 10b. In this case, the interference prevention is further improved.

In FIG. 3, the receiver 5 staying tuned to the frequency F receives the communication wave from the transmitter 10a in the communication area 1a. When the receiver 5 has moved into the area 2, where the shielding signal wave of frequency $F + \Delta F$ is radiated as a high electric field intensity, the tuned frequency of the receiver 5 is shifted by the AFC function to $F + \Delta F$, so that it is difficult to listen to the communication wave of frequency F. In this way, the communication areas 1a and 1b are defined by the communication shielding area 2.

In this case, if the receiver 5 is further provided with the AGC function, the AGC in the case of FIG. 1 is also operated, so that both of the AGC and AFC functions co-operate to almost perfectly eliminate the interference in the area 2.

In the embodiments shown in FIGS. 1 and 3, the communication areas 1a and 1b are limited by the communication shielding area 2 in order to prevent the interference between the two communication areas 1a and 1b. Those embodiments may be modified as shown in FIG. 4 where the signal reception may be made in a limited manner only within a communication area. In FIG. 4, the outer periphery of the loop antenna 11 connected to the transmitter 10 for radiating the communication wave is surrounded by a loop antenna 21', so that the communication area 1 formed by the loop antenna 11 is enclosed by the communication shielding area 2 formed around the communication area 1 by the loop antenna 21'. The transmitter 20 supplies the shielding signal wave of a high power to the loop antenna 21'. As a result, no communication wave leaks outside from the communication area 1, so that it is impossible to listen to the communication signal at an outside area and thus the secrecy of communication is ensured.

The present invention has been described in detail with respect to preferred embodiments, and it will now be apparent from the foregoing to those skilled in the art that changes and modifications may be made without departing from the invention as defined.

What is claimed is:

1. A communication system, comprising:
    (a) a first communication area for receiving first communication signals;
    (b) a second communication area, spaced from said first communication area, for receiving second communication signals;
    (c) a communication shielding area, between said first communication area and said second communication area, for receiving a shielding signal wave and preventing interference between said first and second communication signals;
    (d) communication transmitting means for radiating a first modulated signal and a second modulated signal to said first communication area and said second communication area, said communication transmitting means producing a carrier wave having a fixed frequency and being modulated by said first communication signals and said second communication signals, said first and second communication signals having different content;

(e) shielding transmitting means for transmitting said shielding signal wave into said communication shielding area; and (f) movable receiving means, movable across said first communication area, said communication shielding area and said second communication area and being tuned to said carrier wave fixed frequency, for receiving said first modulated signal, said shielding signal wave and said second modulated signal, respectively, and for demodulating said first modulated signal when in said first communication area and for demodulating said second modulated signal when in said second communication area, said movable receiving means receiving said shielding signal wave when in said shielding communication area at a receiving level equal to or greater than the receiving level of said first modulated signal and said second modulated signal.

2. A communication system as claimed in claim 1, wherein said shielding signal wave is a non-modulated signal.

3. A communication system as claimed in claim 1, wherein said shielding signal wave is a signal modulated by a signal having content different from the content of said first and second communication signals.

4. A communication system as claimed in claim 1, wherein said shielding signal wave is a signal modulated by a signal having a non-audio frequency.

5. A communication system as claimed in claim 1, wherein said movable receiving means has an AGC function, and said shielding signal wave has the same frequency as said fixed frequency of said carrier wave whereby the receiving output level of said first and second communication signals are lowered by said AGC function in accordance with the receiving level of said shielding signal wave when said receiving means has moved from said first or second communication area to said communication shielding area.

6. A communication system as claimed in claim 1, wherein said receiving means has an AFC function and said shielding signal wave has a frequency shifted from said fixed frequency of said carrier wave within a range where said first and second communication signals and said shielding signal wave are controlled by said AFC function, and wherein the tuning of said movable receiving means to the first modulated signal or the second modulated signal is shifted by the AFC function in accordance with the receiving signal level of said shielding signal wave to lower the receiving signal level of said first or second communication signals when said receiving means has moved from first communication area or said second communication area to said communication shielding area.

7. A communication system as claimed in claim 1, wherein said communication transmitting means and said shielding transmitting means have loop transmitting antennas, said first communication area and said second communication area are respectively defined by said loop transmitting antennas of said communication transmitting means, and said communication shielding area is defined by said loop transmitting antenna of said shielding transmitting means.

8. A communication system as claimed in claim 7 wherein said loop transmitting antennas of said communication transmitting means include portions having shield lines adjacent said loop transmitting antenna of said shielding transmitting means.

* * * * *

UNITED STATES PATENT AND TRADEMARK OFFICE
CERTIFICATE OF CORRECTION

PATENT NO. : 4,378,602
DATED : March 29, 1983
INVENTOR(S) : Yutaka Umetsu et al

It is certified that error appears in the above-identified patent and that said Letters Patent is hereby corrected as shown below:

Column 3, line 18, "possible" should be "impossible".

Column 3, line 44, "contents" should be "content".

Signed and Sealed this

Twenty-third Day of August 1983

[SEAL]

Attest:

GERALD J. MOSSINGHOFF

Attesting Officer

Commissioner of Patents and Trademarks